(12) United States Patent
Cho et al.

(10) Patent No.: US 10,711,345 B2
(45) Date of Patent: Jul. 14, 2020

(54) HARD COATING FILM FOR CUTTING TOOL

(71) Applicant: KORLOY INC., Seoul (KR)

(72) Inventors: Seong-woo Cho, Cheongju-si (KR); Dong-youl Lee, Cheongju-si (KR); Jae-hoon Kang, Cheongju-si (KR); Soon-yong Hong, Cheongju-si (KR); Sun-yong Ahn, Cheongju-si (KR); Young-heum Kim, Cheongju-si (KR)

(73) Assignee: KORLOY INC., Seoul (KR)

( * ) Notice: Subject to any disclaimer, the term of this patent is extended or adjusted under 35 U.S.C. 154(b) by 33 days.

(21) Appl. No.: 15/761,112

(22) PCT Filed: May 30, 2017

(86) PCT No.: PCT/KR2017/005608
§ 371 (c)(1),
(2) Date: Mar. 19, 2018

(87) PCT Pub. No.: WO2018/016732
PCT Pub. Date: Jan. 25, 2018

(65) Prior Publication Data
US 2018/0258525 A1    Sep. 13, 2018

(30) Foreign Application Priority Data
Jul. 20, 2016 (KR) .................. 10-2016-0091763

(51) Int. Cl.
*C23C 16/02*    (2006.01)
*C23C 16/36*    (2006.01)
(Continued)

(52) U.S. Cl.
CPC ............. *C23C 16/02* (2013.01); *C23C 16/36* (2013.01); *C23C 16/40* (2013.01); *C23C 16/403* (2013.01);
(Continued)

(58) Field of Classification Search
USPC .......... 51/307, 309; 428/336, 698, 701, 702; 407/119
See application file for complete search history.

(56) References Cited

U.S. PATENT DOCUMENTS 7,192,660 B2 * 3/2007 Ruppi ..................... C23C 16/36
                                                       51/307
7,993,742 B2    8/2011 Ruppi
(Continued)

FOREIGN PATENT DOCUMENTS

JP    08-155724    *  6/1996
JP    2008-087150  *  4/2008
(Continued)

OTHER PUBLICATIONS

International Search Report for PCT/KR2017/005608 dated Aug. 8, 2017 from Korean Intellectual Property Office.

*Primary Examiner* — Archene A Turner
(74) *Attorney, Agent, or Firm* — Revolution IP, PLLC

(57) ABSTRACT

The present invention relates to a hard coating including an MT-TiCN layer and an α-alumina layer which are formed by using a chemical vapor deposition method. A hard coating for cutting tools, which is a coating formed on a base material of a cutting tool formed of a hard material, the coating comprising: a TiCN layer; and an α-alumina layer formed on the TiCN layer, wherein: the α-alumina layer has a main peak (maximal strength peak) of (006) plane located between 20-40 degrees during a psi rocking analysis by an XRD; a residual stress in the α-$Al_2O_3$ layer is −0.9-0.4 GPa; the TiCN layer is composed of $TiC_xN_yO_z$ (x+y+z≤1, x>0, y>0, z≥0); a composition ratio of C/(C+N) is greater than or equal to 0.4 and smaller than 0.5; the ratio of TC(220)/TC (422) is smaller than 0.45; and the ratio of TC(220)/TC(311) is less than 0.45.

2 Claims, 7 Drawing Sheets

(51) Int. Cl.
  *C23C 28/04* (2006.01)
  *C23C 16/40* (2006.01)
  *C23C 16/56* (2006.01)
  *C23C 30/00* (2006.01)

(52) U.S. Cl.
  CPC ............ *C23C 16/56* (2013.01); *C23C 28/042* (2013.01); *C23C 28/044* (2013.01); *C23C 30/00* (2013.01)

(56) References Cited

U.S. PATENT DOCUMENTS

| | | |
|---|---|---|
| 2006/0115662 A1 | 6/2006 | Ruppi |
| 2007/0009763 A1 | 1/2007 | Littecke et al. |
| 2009/0017289 A1* | 1/2009 | Zackrisson ......... C23C 16/0272 407/119 |
| 2012/0015148 A1* | 1/2012 | Ruppi .................... C23C 16/36 428/148 |
| 2012/0144965 A1* | 6/2012 | Engstrom ........... C23C 16/0272 428/336 |
| 2014/0377024 A1* | 12/2014 | Sobana .................. C23C 16/36 407/119 |
| 2016/0175940 A1 | 6/2016 | Lindahl et al. |

FOREIGN PATENT DOCUMENTS

| | | |
|---|---|---|
| KR | 10-2007-0120067 A | 12/2007 |
| KR | 10-2015-0093142 A | 8/2015 |
| KR | 10-2016-0075367 A | 6/2016 |
| KR | 10-2016-0080609 A | 7/2016 |
| WO | 2014/198881 A1 | 12/2014 |

\* cited by examiner

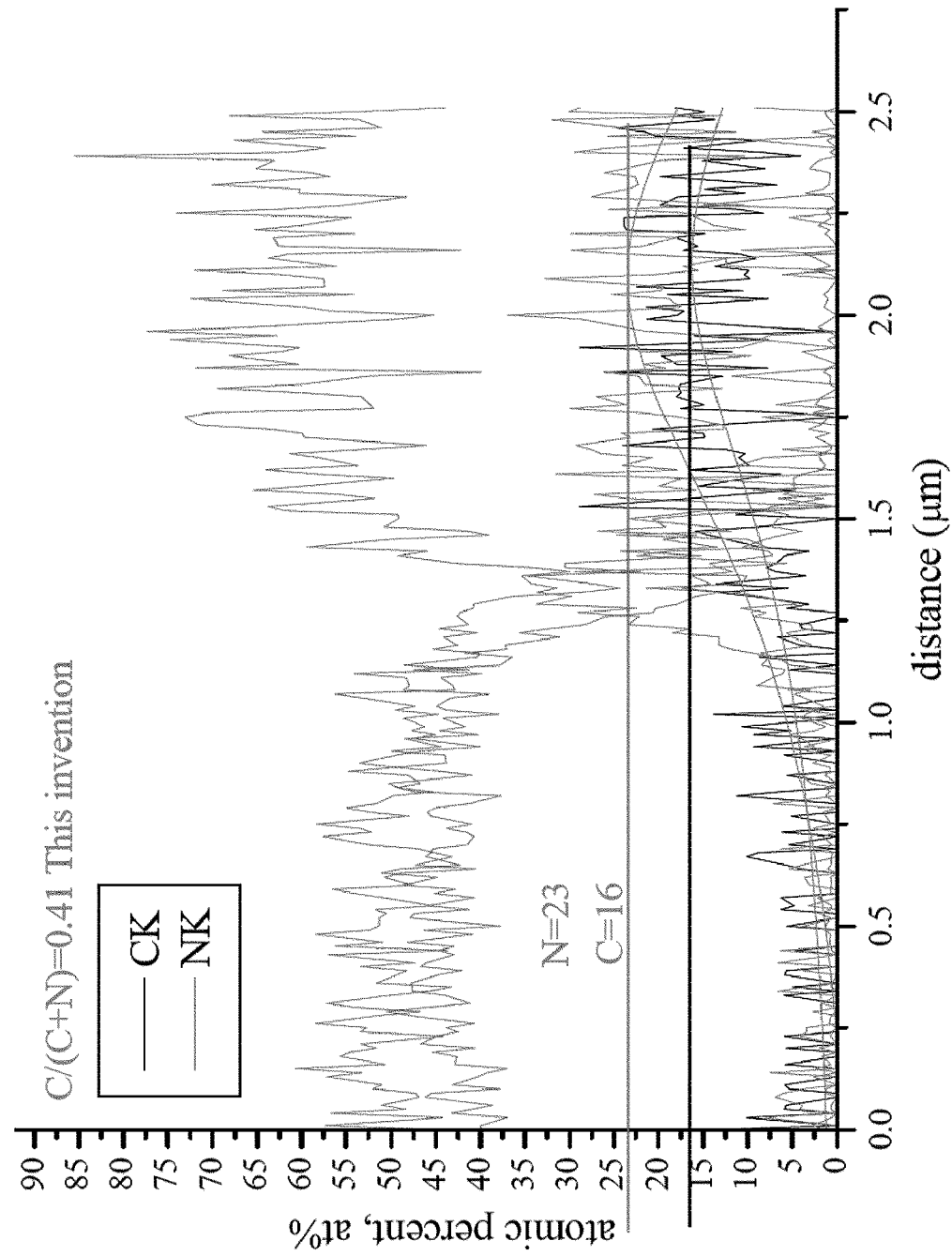
[FIG.1]

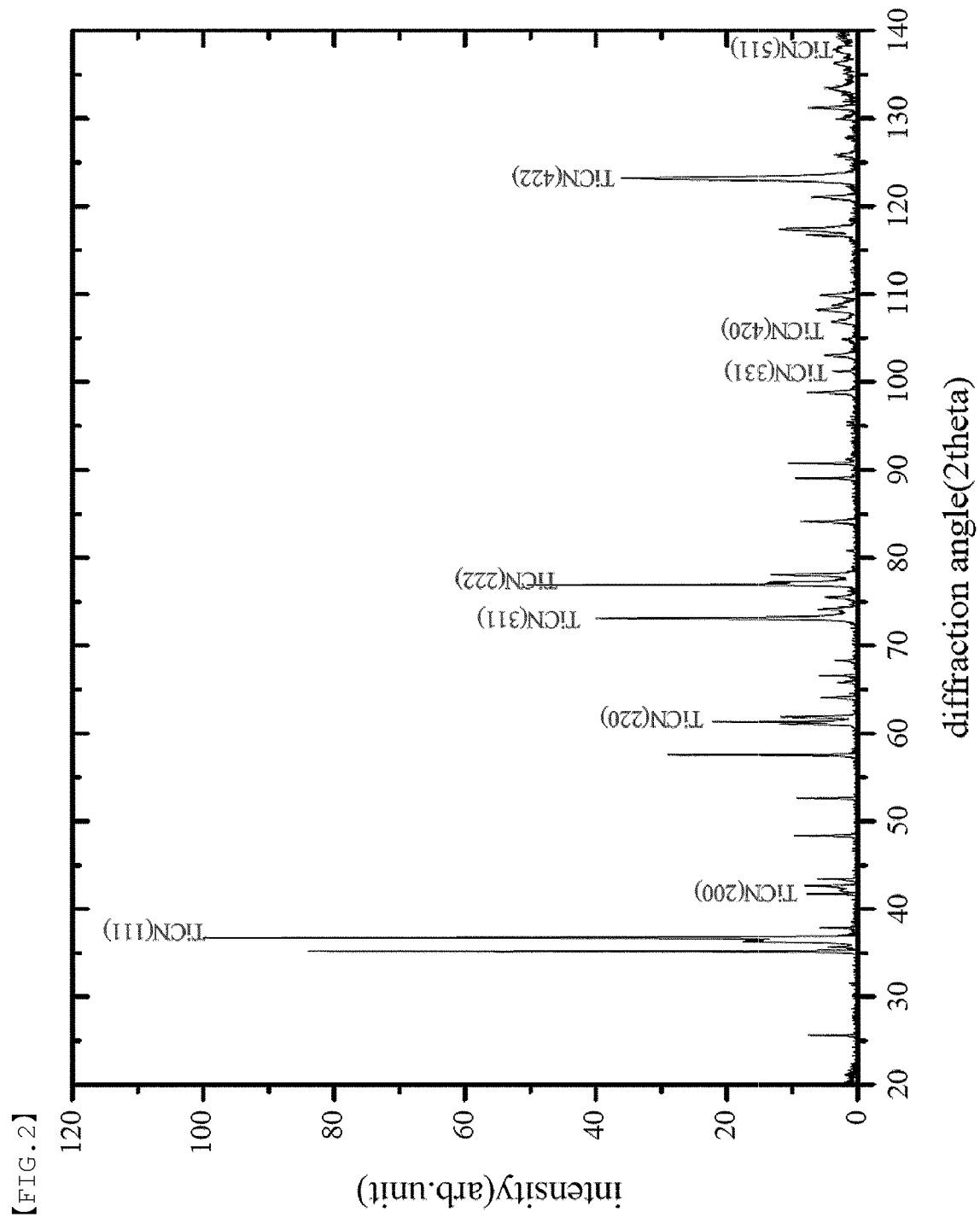
[FIG. 2]

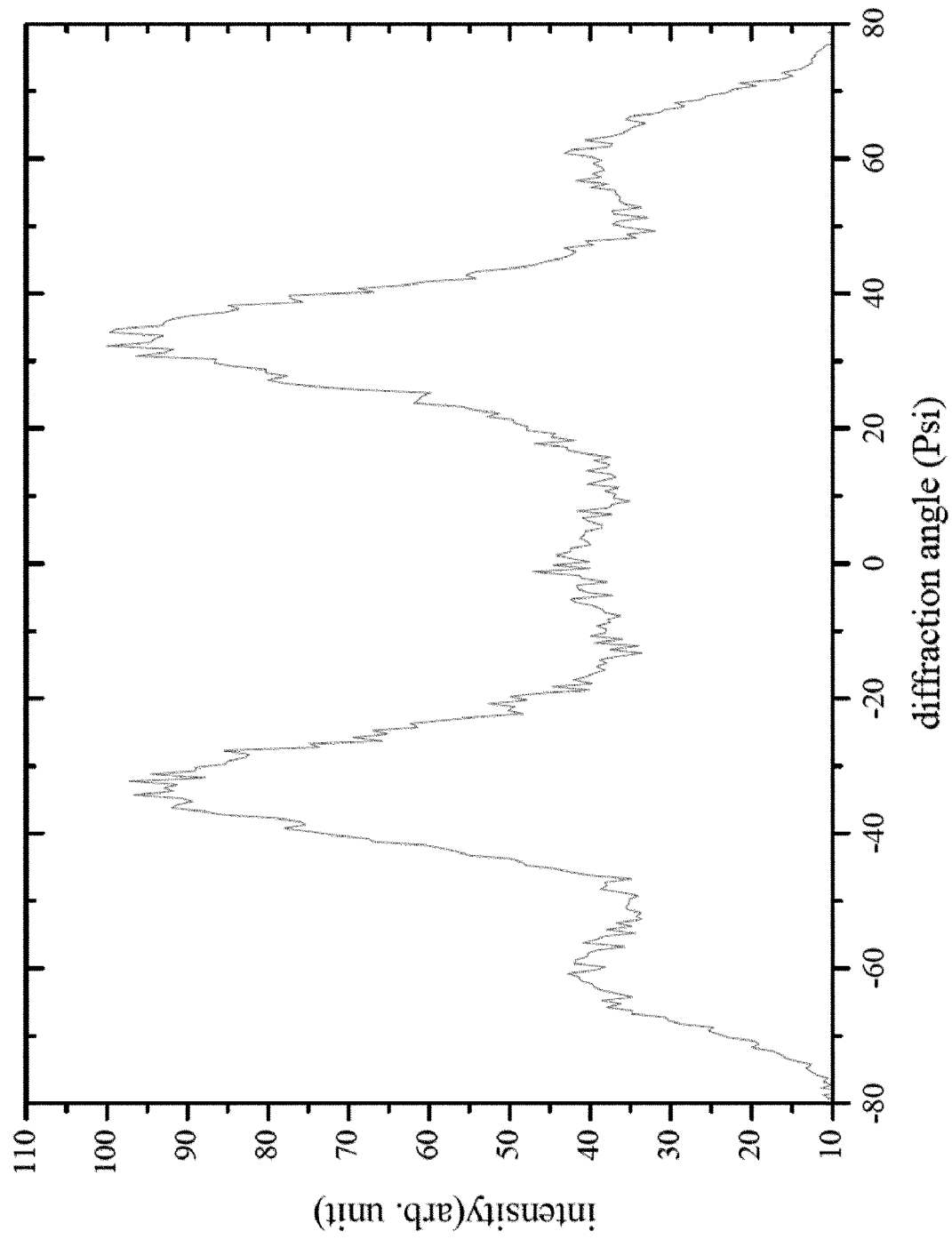
[FIG. 3]

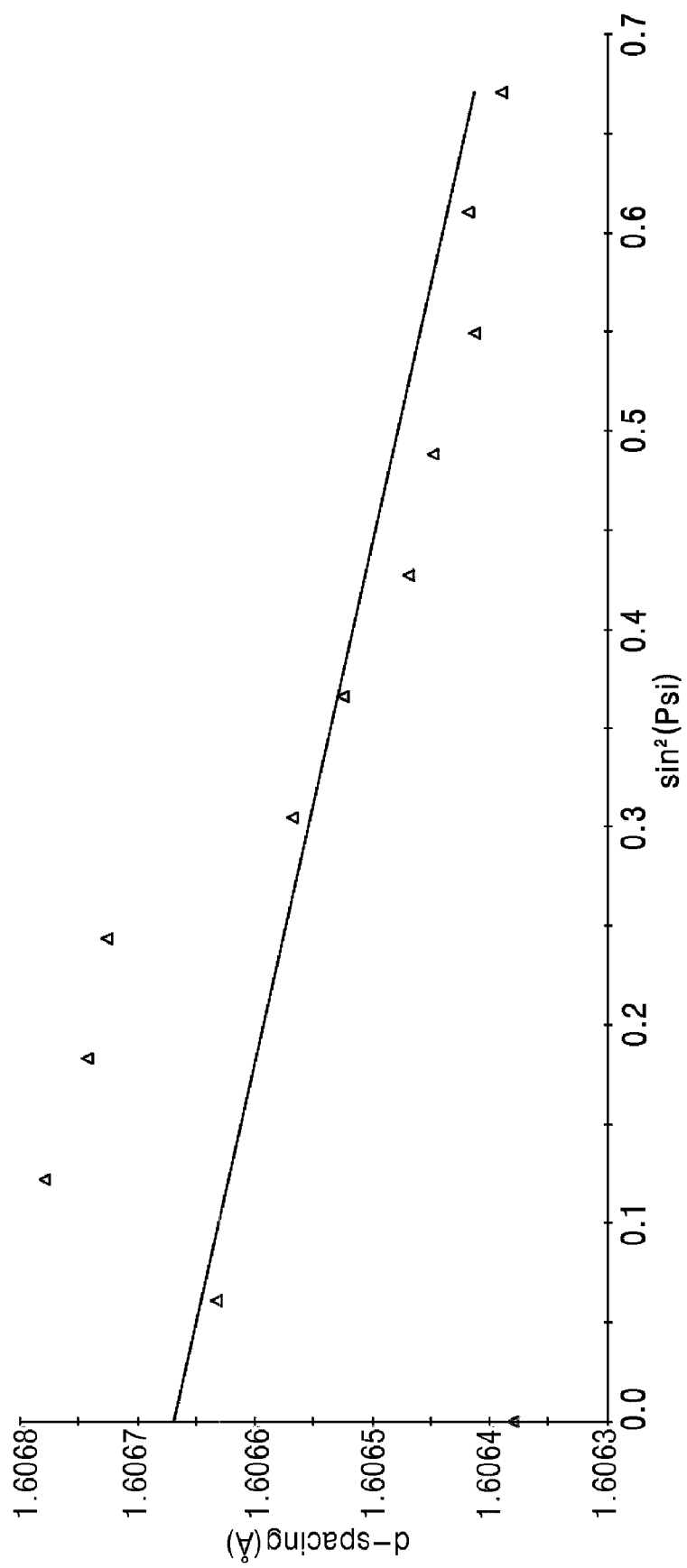
[FIG. 4]

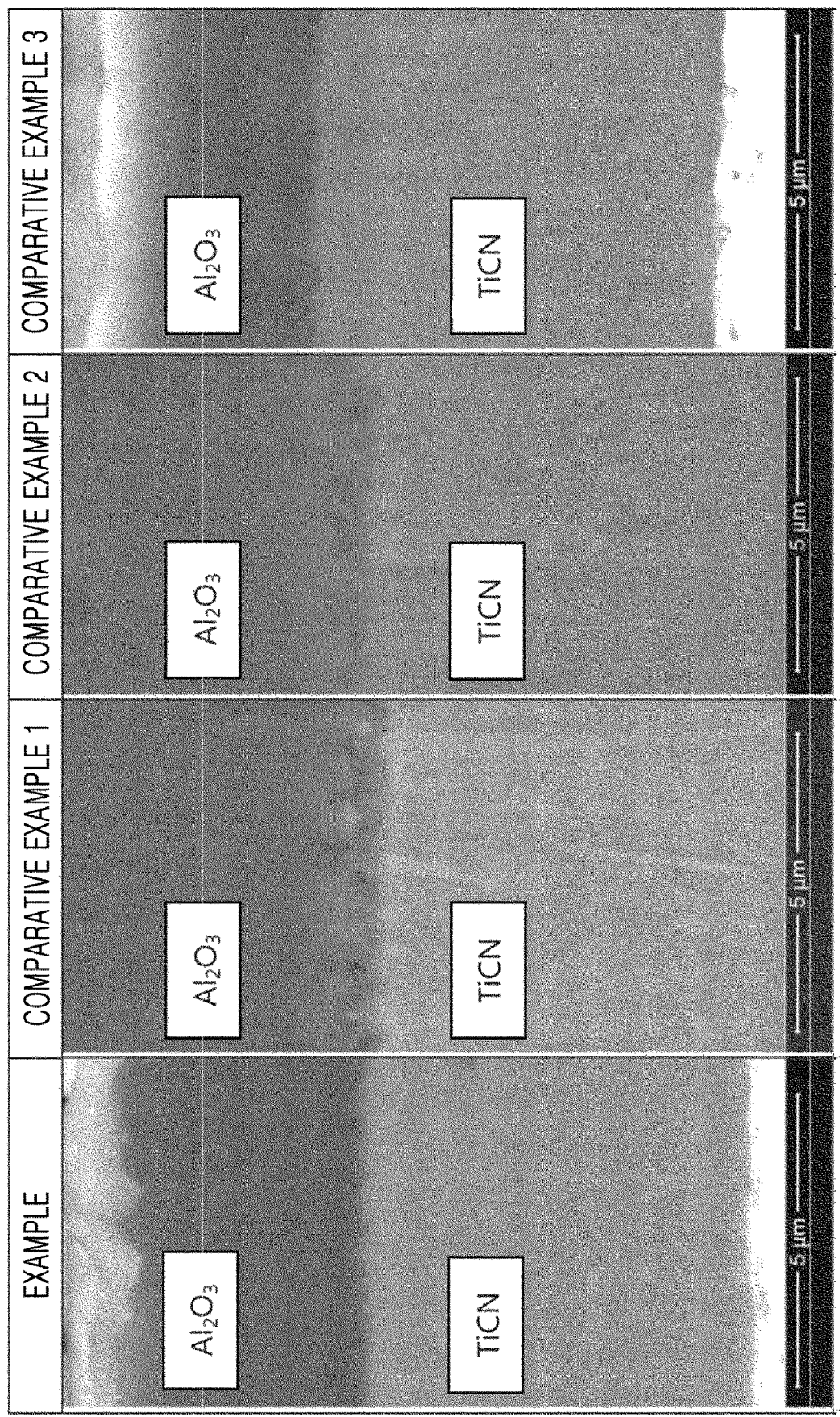
[FIG. 5]

[FIG. 6]

[FIG. 7]
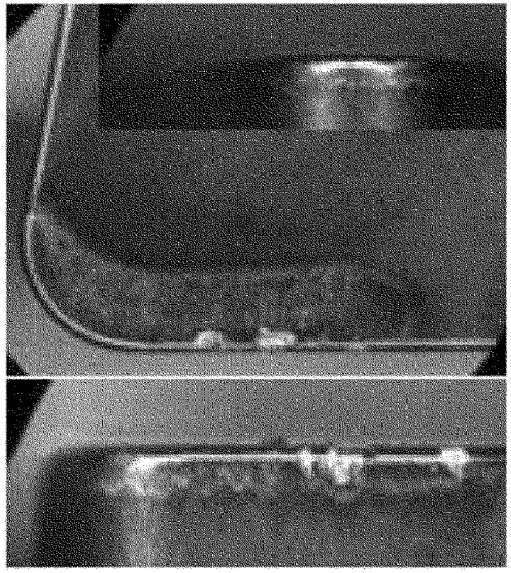
EXAMPLE
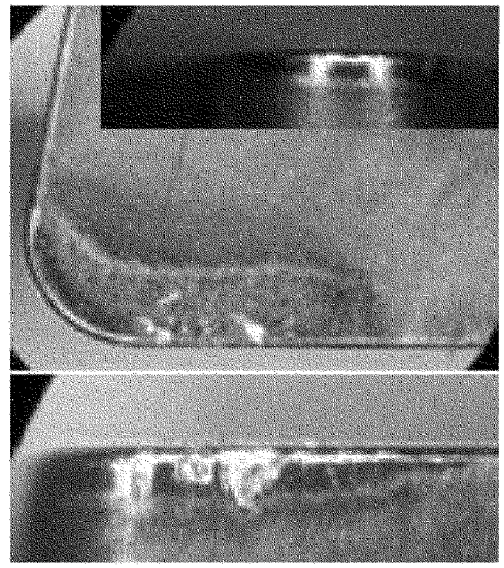
COMPARATIVE EXAMPLE 4
[FIG. 8]
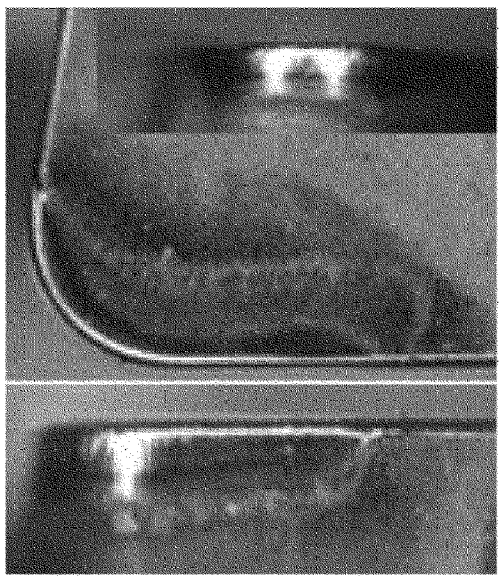
EXAMPLE
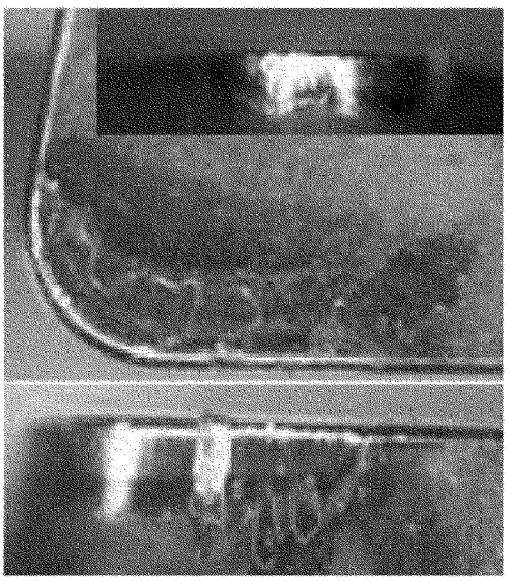
COMPARATIVE EXAMPLE 5

HARD COATING FILM FOR CUTTING TOOL

TECHNICAL FIELD

The present invention relates to a hard coating for cutting tools, which is formed by using a chemical vapor deposition method, and more particularly, to a hard coating for cutting tools, which includes a TiCN layer and an α-alumina layer and has improved chipping resistance and wear resistance by controlling crystal growth (texture) of the α-alumina layer and grain size, composition, and/or crystal growth (texture) of the TiCN layer formed under the α-alumina layer.

BACKGROUND ART

In general, in order to improve wear resistance, cemented carbide used for cutting tools is used after a hard coating layer is formed on the surface thereof, and the hard coating is formed through a chemical vapor deposition method (hereinafter referred to as "CVD") or a physical vapor deposition method (hereinafter referred to as "PVD").

Meanwhile, during high-speed processing of a high-hardness material, a cutting edge of a cutting tool is exposed to a high-temperature environment of approximately 1000° C., and the cutting edge not only wears down due to friction and oxidation caused by contacting a workpiece, but also is subjected to mechanical shock such as a jerk. Therefore, the cutting tools are essentially required to have toughness together with appropriate wear resistance.

In general, a hard coating is composed of a single-layer or multi-layer non-oxide-based thin film (e.g., TiN, TiC, or TiCN), an oxide-based thin film having excellent oxidation resistance (e.g., $Al_2O_3$), or a mixed layer thereof. Examples of the non-oxide-based thin film includes carbides, nitrides, or carbonitrides of metal elements of Group IV, V, and VI in the periodic table, such as TiN, TiC or TiCN, and the examples of the oxide-based thin film representatively includes α-$Al_2O_3$ or κ—$Al_2O_3$.

Meanwhile, a main disadvantage of the non-oxide-based thin film, such as carbides, nitrides, or carbonitrides of metal elements of Group IV, V, and VI in the periodic table, is inferior oxidation resistance, and such a problem is mainly being solved such that an oxide thin film having excellent oxidation resistance such as alumina ($Al_2O_3$) is laminated on a non-oxide thin film and is then subjected to multilayer coating.

However, since a thin film in which non-oxide thin films and oxide thin films are formed in multiple layers has inferior adhesion between the thin films, the mechanical strength tends to be unstable between the thin films during a cutting process in which a high-temperature environment is formed, and particularly, during the processing of workpieces having high stickiness (toughness) inherent in materials thereof, such as bearing steel, nickel-chromium steel, or cold forging steel, the adhesion between the non-oxide thin films and the oxide thin films are further demanded.

Among the oxide-based thin films, κ-$Al_2O_3$ has a merit of having excellent adhesion with a non-oxide-based thin film and being formed in a relatively low temperature, but has a limitation in that a phase transformation, in which a κ-phase is changed into an α-phase, may occur due to a high-temperature caused by cutting, and this phase transformation causes an approximately 6-8% of volume contraction and cracks, and thereby causes a phenomenon of delamination of $Al_2O_3$ thin film.

Compared to this, since α-$Al_2O_3$ is a phase stable in high-temperatures, α-$Al_2O_3$ has a merit of exhibiting excellent wear resistance without causing a phase transformation during a cutting process, but has a limitation in that in order to directly coating a non-oxide-based thin film with —$Al_2O_3$, a high temperature of approximately 1040° C. is required, and adhesion between the α-$Al_2O_3$ formed in this case and a non-oxide-based thin film located under the α-$Al_2O_3$ is decreased.

To solve the limitation, a method is used, in which an oxide layer such as TiCNO or TiCO having a similar composition to a TiCN layer or the like located under a non-oxide-based thin film is formed as a bonding layer on the non-oxide-based thin film, and then, an α-$Al_2O_3$ layer is formed on the bonding layer.

Through such a bonding layer, delamination resistance of the α-$Al_2O_3$ layer may be somewhat improved, but there is still a limitation of exhibiting an insufficient adhesion strength.

Patent documents, such as U.S. Pat. No. 7,993,742 and International Patent Publication No. WO2014/198881, disclose a feature in which the physical properties of a coating film are improved by controlling the grain size and the crystal growth direction of MT-TiCN, or the adhesion of a coating film is improved by controlling the shape and the crystal growth direction of an α-$Al_2O_3$ layer. However, there still remains a room for improvement.

DISCLOSURE OF THE INVENTION

Technical Problem

The purpose of the present invention is to provide a hard coating for cutting tools which has excellent chipping resistance and wear resistance.

Technical Solution

To achieve the above purposes, the present invention provides a hard coating for cutting tools, which is a coating formed on a base material of a cutting tool formed of a hard material, the coating including: a TiCN layer; and an α-alumina layer formed on the TiCN layer, wherein: the α-alumina layer has a main peak (maximal strength peak) of (006) plane located between 20-40 degrees during psi rocking analysis by using XRD; residual stress in the α-Al2O3 layer is −0.9 GPa to 0.4 GPa; the TiCN layer is composed of $TiC_xN_yO_z$ (x+y+z≤1, x>0, y>0, z≥0); a composition ratio of C/(C+N) is greater than or equal to 0.4 and smaller than 0.5; the ratio of TC(220)/TC(422) represented by Formula 1 is smaller than 0.45; and the ratio of TC(220)/TC(422) is smaller than 0.45.

$$TC(hkl)=I(hkl)/Io(hkl)\{1/n\Sigma I(hkl)/Io(hkl)\}-1 \quad \text{[Formula 1]}$$

(in the formula: I(hkl) is a (hkl) reflection strength; Io(hkl) is a standard strength according to JCPDS card 42-1489; n is the number of reflections used for calculation; (hkl) reflection uses (111), (200), (220), (311), (331), (420), (422) and (511)).

Advantageous Effects

A hard coating for cutting tools according to the present invention has chipping resistance and adhesion which are improved compared to conventional arts by controlling contents of C and N, which constitute a TiCN layer, a crystal growth direction of TiCN, and a crystal growth direction of α-alumina.

BRIEF DESCRIPTION OF THE DRAWINGS

FIG. 1 illustrates a measuring result of a ratio of C to N in a TiCN layer constituting a hard coating for cutting tools, which is prepared according to an example of the present invention.

FIG. 2 illustrates XRD evaluation results of a TiCN layer constituting a hard coating for cutting tools, which is prepared according to an example of the present invention.

FIG. 3 illustrates psi rocking analysis results using XRD for α-alumina constituting a hard coating for cutting tools, which is prepared according to an example of the present invention.

FIG. 4 illustrates measuring results of residual stress in α-alumina constituting a hard coating for cutting tools, which is prepared according to an example of the present invention.

FIG. 5 illustrates cross-sectional images of hard coatings for cutting tools which are prepared according to an example of the present invention and comparative examples 1 to 3.

FIG. 6 illustrates cross-sectional images of samples after a delamination resistance test of hard coatings for cutting tools which are prepared according to an example of the present invention and comparative examples 1 to 3.

FIG. 7 illustrates images of samples after a delamination resistance test of hard coatings for cutting tools which are prepared according to an example of the present invention and comparative example 4.

FIG. 8 illustrates images of samples after a delamination resistance test of hard coatings for cutting tools which are prepared according to an example of the present invention and comparative example 5.

MODE FOR CARRYING OUT THE INVENTION

Hereinafter, embodiments of the present invention will be described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A hard coating according to the present invention is a coating formed on a base material of a cutting tool formed of a hard material, the coating including: a TiCN layer; and an α-alumina layer formed on the TiCN layer, wherein: the α-alumina layer has a main peak (maximal strength peak) of (006) plane located between 20-40 degrees during a psi rocking analysis by an XRD; residual stress in the α-$Al_2O_3$ layer is −0.9 GPa to 0.4 GPa; the TiCN layer is composed of $TiC_xN_yO_z$ (x+y+z≤1, x>0, y>0, z≥0); a composition ratio of C/(C+N) is greater than or equal to 0.4 and smaller than 0.5.

As said hard material, various hard materials used for cutting tools, such as cemented carbide (WC—Co alloy), or Cermet, but cemented carbide may favorably be used.

The TiCN layer may favorably be a TiCN layer formed through an MT-CVD process in which a process temperature of smaller than or equal to 850-900° C., a main reaction gas including 9-10% of $TiCl_4$, 0.5-2% of $CH_3CH$, 70-80% of $H_2$, 10-15% of $N_2$, and 0.5-2.0% of HCl (where, % means a volume %, and hereinafter % which determines a flow rate of a reaction gas are all volume %), and a process pressure of 70-90 mbar are used in a vertical-type hot wall reactor.

In addition, when the thickness of the TiCN layer is smaller than 7 μm, contribution to extending a tool service life in cutting processes may be weak, and when greater than 10 μm, chipping may easily occur during cutting processes, and therefore the thickness of 7-10 μm is preferable.

In addition, as a bonding layer, a $TiC_xN_yO_z$(x+y+z=1, x>0, y>0, z>0) layer, which is selectively formed by using a process temperature of approximately 980-1020° C., a reaction gas including 75-85% of $H_2$, 10-13% of $N_2$, 6-9% of $TiCl_4$, 0.5-1.5% of $CH_4$, and 0.5-1.5% of CO, and a pressure of 60-80 mbar, may be formed.

In addition, when the thickness of the bonding layer is smaller than 0.5 μm, it is difficult to derive a uniform nucleation of α-alumina, and when greater than 1 μm, the bonding layer becomes weak against a mechanical shock due to high brittleness. Therefore, the bonding layer does not sufficiently function as a bonding layer of α-alumina and the TiCN layer, and thus, the thickness of the bonding layer is favorably 0.5-1 μm.

In addition, on the TiCN layer or the bonding layer, an α-alumina layer, which is formed by using a process temperature of 1000-1020° C., a reaction gas including 81-83% of $H_2$, 1.0-2.0% of CO, 2-3.0% of $CO_2$, 0.1-0.8% of $H_2S$, 1.5-2.5% of HCl, and 10-13.0% of $AlCl_3$, and a pressure of 60-90 mbar, is preferably formed.

In addition, when the thickness of the α-alumina layer is smaller than 1 μm, there is a drawback in that oxidation resistance becomes weak during a high-speed cutting process, and when greater than 10 μm, the brittleness of alumina increases in proportion to the thickness and therefore there is a limitation in that the α-alumina layer may be used only for a continuous cutting process and is difficult to be used for a cutting process in which a jerk is generated. Therefore, the thickness of the α-alumina layer is favorably 1-10 μm.

At this point, in the case of the α-alumina layer, when a psi rocking analysis using XRD is performed with regard to (006) plane, it is preferable that the main peak thereof be positioned between 20-40 degrees. The feature in which the main peak is positioned between 20-40 degrees means that the feature in which the angle defined by a normal line of the surface of a base material and the growth direction of the (006) plane is 20-40 degrees becomes dominant, and thus, cutting performance may be improved by controlling the growth direction of the α-alumina.

Preferably, in the TiCN layer, it is preferable that the composition ratio of C/(C+N) be greater than or equal to 0.4 and smaller than 0.5, in other words, the content of N be relatively greater than that of C. As such, chipping resistance may be improved by using a TiCN layer having a relatively grater N content, and at this point, when the composition ratio of C/(C+N) is smaller than 0.4, the content of C becomes excessively low and may not thereby suppress the granular growth of TiCN. Therefore, a problem such as formation of air holes between TiCN and the α-alumina layer may unfavorably be caused.

In addition, it is preferable that the α-alumina layer have residual stress within the range of −0.9 GPa to 0.4 GPa. When the residual stress is a compressive stress greater than −0.9 GPa, damage such as drop off of particles of the α-alumina layer may be easily caused, and when the residual stress is a tensile stress greater than 0.4 GPa, a thermal crack, which is generated due to the difference in thermal expansion coefficients of the base material, TiCN, and the α-alumina layer after CVD coating and is present in a coating layer, is easily propagated by an external shock occurring in a cutting process, and easily causes a chipping or damage phenomenon. Therefore, it is preferable to perform a post-process to maintain the range of −0.9 GPa to 0.4 GPa.

At this point, as a post-processing method, a blasting method, in which ceramic media having a particle size distribution of 200-500 mesh and an injection pressure of 0.5-2.0 bar are used, may favorably be used, but a method which may only apply residual stress within said range without causing damage to the α-alumina layer may be used without particular limitation.

In addition, when the thickness of the TiCN layer is smaller than 7 μm, wear resistance or a tool life may be decreased during processing of steel or cast iron, and when greater than 10 μm, the particles of TiCN grows or metal elements such as Co or W may be scattered into a coating from a base material and generate air holes in the coating, and therefore the thickness of the TiCN layer is favorably 7-10 μm.

In addition, to obtain properties of a hard coating according to the present invention, in the TiCN layer, a crystal growth direction may be preferably controlled so as to satisfy a condition which is represented by following [Formula 1] and in which the ratio TC(220)/TC(422) of TC(200) and TC(422) is smaller than 0.45, and the ratio TC(220)/TC(311) of TC(220) and TC(311) is smaller than 0.45.

$$TC(hkl) = I(hkl)/Io(hkl)\{1/n\Sigma I(hkl)/Io(hkl)\}^{-1}$$ [Formula 1]

(in the formula: I(hkl) is a (hkl) reflection strength; Io(hkl) is a standard strength according to JCPDS card 42-1489; n is the number of reflections used for calculation; (hkl) reflection uses (111), (200), (220), (311), (331), (420), (422) and (511)).

EXAMPLE

On a cemented carbide cutting insert base material containing 5~9 wt % of Co, 2-4 wt % of TaC, 0-3 wt % of NbC, 0-2 wt % of TiCN and a remainder of WC and having a shape of CNMA120408, a TiCN layer having a thickness of 7.5 μm was formed through an MT-CVD process in which a process temperature of 875° C., a main reaction gas including 9% of TiCl$_4$, 1.0% of CH$_3$CH, 76% of H$_2$, 13% of N$_2$, and 1.0% of HCl, and a process pressure of 70 mbar were used in a vertical type hot wall reactor.

Subsequently, on an upper layer of TiCN, a TiCNO layer, which was a bonding layer having a thickness of 0.7 μm, was formed by using a process temperature of approximately 1000° C., a reaction gas including 80% of H$_2$, 12% of N$_2$, 7% of TiCl$_4$, 1.0% of CH$_4$, 1.0% of CO, and a pressure of 75 mbar.

In addition, on the TiCNO layer, an α-alumina layer having a thickness of 5 μm was formed by using a process temperature of 1005° C., a reaction gas including 82% of H$_2$, 1.5% of CO, 2.5% of CO$_2$, 0.5% of H$_2$S, 2.0% of HCl, and 12.0% of AlCl$_3$, and a pressure of 80 mbar.

FIG. 1 illustrates measuring results of a ratio of C to N in a TiCN layer constituting a hard coating for cutting tools, which is prepared according to an example of the present invention. As illustrated in FIG. 1, the ratio C/(C+N) of a TiCN layer constituting a hard coating according to an example of the present invention was 0.41, and a relatively rich content of N was shown.

FIG. 2 illustrates XRD evaluation results of a TiCN layer constituting a hard coating for cutting tools, which is prepared according to an example of the present invention. The result of obtaining a texture coefficient (TC) regarding each of crystal planes using Formula 1 through an XRD analysis of the coated TiCN layer is as follows.

TABLE 1

| Crystal plane | I$_0$ | I | I/I$_0$ | TC |
|---|---|---|---|---|
| (111) | 59 | 100 | 1.69 | 1.251 |
| (200) | 100 | 18.92 | 0.19 | 0.140 |
| (220) | 46 | 56.87 | 1.24 | 0.913 |
| (311) | 25 | 77.92 | 3.12 | 2.301 |
| (331) | 10 | 9.89 | 0.99 | 0.730 |
| (420) | 23 | 10.28 | 0.45 | 0.330 |
| (422) | 22 | 63.08 | 2.87 | 2.116 |
| (511) | 19 | 5.66 | 0.30 | 0.220 |

As shown in Table 1, the ratio of TC(220)/TC(311) according to an example of the present invention was 0.39 and the ratio of TC(220)/TC(422) was 0.43. The ratios respectively showed values smaller than 0.45.

FIG. 3 illustrates psi rocking analysis results using XRD for α-alumina constituting a hard coating for cutting tools, which is prepared according to an example of the present invention. As illustrated in FIG. 3, the main peak of the (006) plane is positioned within the range of 20-40 degrees, and this means that crystals, having growth directions of the (006) plane inclined within the range of 20-40 degrees with respect to a normal line of a base material are mainly formed.

Onto the surface of the α-alumina formed as such, a blasting surface treatment for injecting alumina powder having particle size distribution of 200-400 mesh with a nozzle pressure of 1.1 bar was performed. As a result, as illustrated in FIG. 4, the residual stress of the α-alumina was made to be in a state of weak compressive stress of −0.08 GPa.

Comparative Example 1

In the same manner as the example, on a cemented carbide cutting insert base material having a shape of CNMA120408, a TiCN layer having a thickness of 7.5 μm was formed through an MT-CVD process in which a process temperature of 875° C., a main reaction gas including 10.5% of TiCl$_4$, 0.4% of CH$_3$CH, 76% of H$_2$, 11.9% of N$_2$, and 1.2% of HCl, and a process pressure of 80 mbar were used in a vertical-type hot wall reactor.

Subsequently, on an upper layer of TiCN, a TiCNO layer, which was a bonding layer having a thickness of 0.7 μm, was formed by using a process temperature of approximately 1000° C., a reaction gas including 79% of H$_2$, 11.0% of N$_2$, 7.5% of TiCl$_4$, 1.2% of CH$_4$, 1.3% of CO, and a pressure of 65 mbar.

In addition, on the TiCNO layer, an α-alumina layer having a thickness of 5 μm was formed by using a process temperature of 1005° C., a reaction gas including 82% of H$_2$, 1.5% of CO, 2.5% of CO$_2$, 0.5% of H$_2$S, 2.0% of HCl, and 11.5% of AlCl$_3$, and a pressure of 85 mbar.

The TiCN layer, which constituted a hard coating according to comparative example 1 and was prepared as such, was formed in the same manner as the example of the present invention, and the layer composition ratio of C/(C+N) was 0.41. In addition, the ratio of TC(220)/TC(311) was 0.39 and the ratio of TC(220)/TC(422) was 0.43. The two ratios respectively showed values smaller than 0.45. However, as a result of psi rocking analysis using XRD regarding the α-alumina layer constituting the hard coating according to comparative example 1, the main peak of the (006) plane was positioned within the range of 0-10 degrees. That is, in comparative example 1, the crystal growth direction of the α-alumina layer was formed such that a normal line of the base material and the main extension direction of the (006) plane were nearly the same as each other.

Comparative Example 2

In the same manner as the example, on a cemented carbide cutting insert base material having a shape of CNMA120408, a TiCN layer having a thickness of 7.5 μm was formed through an MT-CVD process in which a process temperature of 875° C., a main reaction gas including 10.5% of $TiCl_4$, 0.4% of $CH_3CH$, 84% of $H_2$, 4% of $N_2$, and 1.1% of HCl, and a process pressure of 80 mbar were used in a vertical-type hot wall reactor.

Subsequently, on an upper layer of TiCN, a TiCNO layer, which was a bonding layer having a thickness of 0.7 μm, was formed by using a process temperature of approximately 1000° C., a reaction gas including 79% of $H_2$, 11.0% of $N_2$, 7.5% of $TiCl_4$, 1.2% of $CH_4$, 1.3% of CO, and a pressure of 65 mbar.

In addition, on the TiCNO layer, an α-alumina layer having a thickness of 5 μm was formed by using a process temperature of 1005° C., a reaction gas including 82% of $H_2$, 1.5% of CO, 2.5% of $CO_2$, 0.5% of $H_2S$, 2.0% of HCl, and 11.5% of $AlCl_3$, and a pressure of 85 mbar.

The TiCN layer, which constituted a hard coating according to comparative example 2 and was prepared as such, was formed to have relatively more content of C unlike the example of the present invention, and the layer composition ratio of C/(C+N) was 0.5-0.65. In addition, the ratio of TC(220)/TC(311) was 0.39 and the ratio of TC(220)/TC(422) was 0.43. The two ratios respectively showed values smaller than 0.45.

In addition, the α-alumina layer constituting the hard coating according to comparative example 2 was formed in the same manner as the example of the present invention, and as a result of psi rocking analysis using XRD, the main peak of the (006) plane was positioned within the range of 20-40 degrees.

Comparative Example 3

In the same manner as the example, on a cemented carbide cutting insert base material having a shape of CNMA120408, a TiCN layer having a thickness of 7.5 μm was formed through an MT-CVD process in which a process temperature of 875° C., a main reaction gas including 10.5% of $TiCl_4$, 0.4% of $CH_3CH$, 84% of $H_2$, 4% of $N_2$, and 1.1% of HCl, and a process pressure of 80 mbar were used in a vertical-type hot wall reactor.

Subsequently, on an upper layer of TiCN, a TiCNO layer, which was a bonding layer having a thickness of 0.7 μm, was formed by using a process temperature of approximately 1000° C., a reaction gas including 79% of $H_2$, 11.0% of $N_2$, 7.5% of $TiCl_4$, 1.2% of $CH_4$, 1.3% of CO, and a pressure of 65 mbar.

In addition, on the TiCNO layer, an α-alumina layer having a thickness of 5 μm was formed by using a process temperature of 1005° C., a reaction gas including 82% of $H_2$, 1.5% of CO, 2.0% of $CO_2$, 1.0% of $H_2S$, 2.0% of HCl, and 11.5% of $AlCl_3$, and a pressure of 85 mbar.

The TiCN layer, which constituted a hard coating according to comparative example 3 and was prepared as such, was formed to have relatively rich content of C unlike the example of the present invention, and the layer composition ratio of C/(C+N) was 0.5-0.65. In addition, the ratio of TC(220)/TC(311) was 0.39 and the ratio of TC(220)/TC(422) was 0.43. The two ratios respectively showed values smaller than 0.45.

In addition, as a result of psi rocking analysis using XRD regarding the α-alumina layer constituting the hard coating according to comparative example 1, the main peak of the (006) plane was positioned within the range of 0-10 degrees.

Comparative Example 4

In the same manner as the example, on a cemented carbide cutting insert base material having a shape of CNMA120408, a TiCN layer having a thickness of 7.5 μm was formed through an MT-CVD process in which a process temperature of 875° C., a main reaction gas including 9% of $TiCl_4$, 1.0% of $CH_3CH$, 76% of $H_2$, 13% of $N_2$, and 1.0% of HCl, and a process pressure of 70 mbar were used in a vertical-type hot wall reactor.

Subsequently, on an upper layer of TiCN, a TiCNO layer, which was a bonding layer having a thickness of 0.7 μm, was formed by using a process temperature of approximately 1000° C., a reaction gas including 80% of $H_2$, 12% of $N_2$, 7% of $TiCl_4$, 1.0% of $CH_4$, 1.0% of CO, and a pressure of 75 mbar.

In addition, on the TiCNO layer, an α-alumina layer having a thickness of 5 μm was formed by using a process temperature of 1005° C., a reaction gas including 82% of $H_2$, 1.5% of CO, 2.5% of $CO_2$, 0.5% of $H_2S$, 2.0% of HCl, and 12.0% of $AlCl_3$, and a pressure of 80 mbar.

On the surface of the α-alumina, a blasting surface treatment using ceramic media having particle size distribution of 200-500 meshes with an injection pressure of 2.5 bar was performed, and as a result, the residual stress formed in the α-alumina layer was −1.3 GPa.

Comparative Example 5

In the same manner as the example, on a cemented carbide cutting insert base material having a shape of CNMA120408, a TiCN layer having a thickness of 7.5 μm was formed through an MT-CVD process in which a process temperature of 875° C., a main reaction gas including 7.5% of $TiCl_4$, 2.5% of $CH_3CH$, 69% of $H_2$, 20% of $N_2$, and 1.0% of HCl, and a process pressure of 70 mbar were used in a vertical-type hot wall reactor.

Subsequently, on an upper layer of TiCN, a TiCNO layer, which was a bonding layer having a thickness of 0.7 μm, was formed by using a process temperature of approximately 1000° C., a reaction gas including 80% of $H_2$, 12% of $N_2$, 7% of $TiCl_4$, 1.0% of $CH_4$, 1.0% of CO, and a pressure of 75 mbar.

In addition, on the TiCNO layer, an α-alumina layer having a thickness of 5 μm was formed by using a process temperature of 1005° C., a reaction gas including 82% of $H_2$, 1.5% of CO, 2.5% of $CO_2$, 0.5% of $H_2S$, 2.0% of HCl, and 12.0% of $AlCl_3$, and a pressure of 80 mbar. In this case, after the XRD analysis regarding TiCN, the ratio of TC(220)/TC(311) was smaller than 4.5, but the ratio of TC(220)/TC(422) was greater than 4.5.

Microstructure

FIG. 5 illustrates cross-sectional images of hard coatings for cutting tools, which is prepared according to an example and comparative examples 1 to 3 of the present invention.

TABLE 2

| | TiCN | | Main peak position = interplanar angle of α (006) planes | | Porosity |
|---|---|---|---|---|---|
| | C/(C + N) = 0.41 | C/(C + N) = 0.5~0.65 | 20-40 degrees | 0-10 degrees | |
| Example | ★ | | ★ | | Air hole absent |
| Comparative example 1 | ★ | | | ★ | Air hole Present |
| Comparative example 2 | | ★ | ★ | | Air hole present |
| Comparative example 3 | | ★ | | ★ | Air hole present |

In the table above, a star mark means that a suggested condition is satisfied.

As shown in FIG. 5 and Table 2, it may be understood that combinations of a TiCN of microparticles, in which the ratio of C/(C+N) satisfies the range of 0.4 to 0.5 as in the example of the present invention, and the α-alumina, in which the (006) plane is slopingly formed with respect to a normal line of the base material, showed a better porosity than other combinations. That is, it may be understood that the combinations according to the example of the present invention exhibit a better adhesion between thin films.

Delamination Resistance Test

Figure 6:
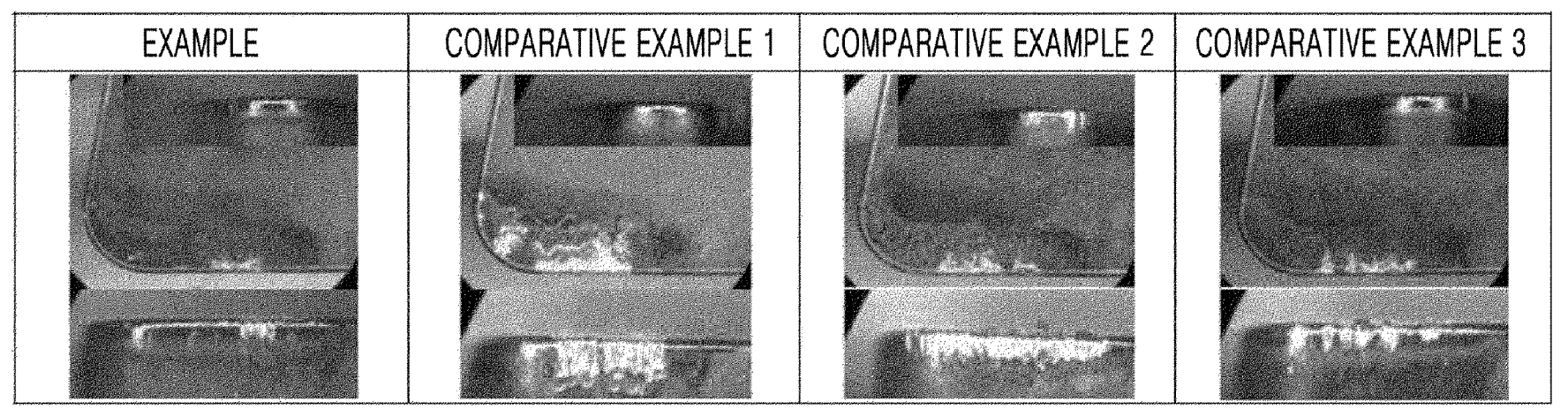

To evaluate the delamination resistance of hard coatings formed according to the example of the present invention and comparative examples 1 to 3, the delamination resistance was evaluated under the same conditions.
(1) Number of revolutions: 2000 rpm
(2) Feeding speed: 0.4 mm/rev
(3) Depth of cut: 1.5 mm
(4) Cutting oil: wet type
(5) Workpiece: FCD500
(6) Shape and type: CNMA120408 and ISO CVD K15 material type Table 3 below shows a test result of delamination resistance of hard coatings prepared according to the example of the present invention and comparative examples 1 to 3, and FIG. 6 illustrates images of samples after a delamination resistance test of hard coatings prepared according to the example of the present invention and comparative examples 1 to 3.

TABLE 3

| | TiCN | | Main peak position = interplanar angle of α (006) planes | | Delamination resistance |
|---|---|---|---|---|---|
| | C/(C+ N) 0.41 | C/(C+ N) 0.5~0.65 | 20~40 degress | 0~10 degrees | |
| Example | ★ | | ★ | | Few delamination around cutting edge |
| Comparative example 1 | ★ | | | ★ | Many delamination around cutting edge |
| Comparative example 2 | | ★ | ★ | | Many delamination around cutting edge |
| Comparative example 3 | | ★ | | ★ | Many delamination around cutting edge |

In the table above, a star mark means that a suggested condition is satisfied.

As illustrated in FIG. 6, it may be found that the hard coating according to the example of the present invention shows improved delamination resistance compared to the hard coatings according to comparative examples 1 to 3.

Table 4 below shows a test result of delamination resistance of hard coatings prepared according to the example of the present invention and comparative examples 4, and FIG. 7 illustrates images of samples after a delamination resistance test of hard coatings prepared according to the example of the present invention and comparative examples 4.

표 4

| | TiCN | | Main peak position = interplanar angle of α(006) planes | | Stress in α(006) plane, σ(GPa) | | |
|---|---|---|---|---|---|---|---|
| | C/(C + N) 0.41 | C/(C + N) 0.5~0.65 | 20-40 degrees | 0-10 degrees | −0.9 < σ < 0.4 | σ > 0.4 σ > −0.9 | Delamination resistance |
| Example | ★ | | ★ | | ★ | | Relatively few delamination around cutting edge |
| Comparative example 1 | ★ | | ★ | | | ★ | Few delamination around cutting edge |

In the table above, a star mark means that a suggested condition is satisfied.

As illustrated in FIG. 7, it may be found that the hard coating according to the example of the present invention shows improved delamination resistance compared to the hard coatings according to comparative examples 4, and that a state, in which the absolute value of residual stress in an α-alumina thin film doest not become large, is preferable.

Wear Resistance Test

To evaluate the wear resistance of hard coatings formed according to the example of the present invention and comparative examples 5, wear resistance was evaluated under the same conditions.

(1) Speed: 400 m/min
(2) Feeding speed: 0.35 mm/rev
(3) Depth of cut: 2.0 mm
(4) Cutting oil: wet type
(5) Workpiece: FCD500
(6) Shape and type: CNMA120408 and ISO CVD K15 material type Table 5 below shows a test result of wear resistance of hard coatings prepared according to the example of the present invention and comparative examples 5, and FIG. 8 illustrates images of samples after a wear resistance test of hard coatings prepared according to the example of the present invention and comparative examples 5.

표 5

| | TiCN (At least 7μm) | | Main peak position = interplanar angle of α (006) planes | | In TiCN, TC(220)/TC(422) and TC(220)/TC(311) are smaller than 0.45 | | Wear resistance |
|---|---|---|---|---|---|---|---|
| | C/(C + N) 0.41 | C/(C + N) 0.5~0.65 | 20-40 degrees | 0-10 degrees | Satisfy | Unsatisfy | |
| Example | ★ | | ★ | | ★ | | Few delamination around cutting edge Small wear of cutting edge |
| Comparative example 5 | ★ | | ★ | | | ★ | Relatively many delamination around cutting edge Relatively much wear of cutting edge |

In the table above, a star mark means that a suggested condition is satisfied.

As illustrated in FIG. 8, it may be found that the cases, in which the ratio of TC(422) and TC(311) to TC(220), which are texture coefficients are all smaller than 0.45, show better delamination resistance and wear resistance than comparative example 5 which does not belong to the cases.

The invention claimed is:

1. A hard coating for cutting tools, which is a coating formed on a base material of a cutting tool formed of a hard material, the coating comprising:
a TiCN layer; and
an α-alumina layer formed on the TiCN layer, wherein:
the α-alumina layer has a main peak (maximal strength peak) of (006) plane located between 20-40 degrees during a psi rocking analysis by an XRD;
a residual stress in the α-Al$_2$O$_3$ layer is −0.9-0.4 GPa;
the TiCN layer is composed of TiC$_x$N$_y$O$_z$ (x+y+z≤1, x>0, y>0, z≥0);
a composition ratio of C/(C+N) is greater than or equal to 0.4 and smaller than 0.5;
the ratio of TC(220)/TC(422) represented by Formula 1 is smaller than 0.45; and
the ratio of TC(220)/TC(311) is smaller than 0.45, $$TC(hkl)=I(hkl)/Io(hkl)\{1/n\Sigma I(hkl)/Io(hkl)\}-1, \quad \text{[Formula 1]}$$

wherein:
I(hkl) is a (hkl) reflection strength;
Io(hkl) is a standard strength according to JCPDS card 42-1489;
n is the number of reflections used for calculation; and
(hkl) reflection uses (111), (200), (220), (311), (331), (420), (422) and (511)).

2. The hard coating for cutting tools of claim 1, wherein a thickness of the TiCN layer is 7-10 μm.

* * * * *